(12) United States Patent
Cohen et al.

(10) Patent No.: US 11,856,798 B2
(45) Date of Patent: Dec. 26, 2023

(54) RESISTIVE RANDOM-ACCESS MEMORY RANDOM NUMBER GENERATOR

(71) Applicant: International Business Machines Corporation, Armonk, NY (US)

(72) Inventors: Guy M. Cohen, Westchester, NY (US); Takashi Ando, Eastchester, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 17/652,970

(22) Filed: Mar. 1, 2022

(65) Prior Publication Data
US 2023/0284462 A1     Sep. 7, 2023

(51) Int. Cl.
*G11C 13/00* (2006.01)
*H10B 63/00* (2023.01)
*H10N 70/00* (2023.01)
*H03K 3/84* (2006.01)

(52) U.S. Cl.
CPC ......... *H10B 63/80* (2023.02); *G11C 13/0002* (2013.01); *H03K 3/84* (2013.01); *H10N 70/021* (2023.02); *H10N 70/826* (2023.02); *H10N 70/841* (2023.02)

(58) Field of Classification Search
None
See application file for complete search history.

(56) References Cited

U.S. PATENT DOCUMENTS

| | | | |
|---|---|---|---|
| 8,227,788 B2 * | 7/2012 | Mikawa | H10N 70/026 438/570 |
| 8,680,906 B1 | 3/2014 | McDonald et al. | |
| 9,029,829 B1 * | 5/2015 | Echeverry | H10B 63/84 257/4 |
| 9,747,982 B1 | 8/2017 | Shifren et al. | |

(Continued)

OTHER PUBLICATIONS

B. Lin et al., "A High-Speed and High-Reliability TRNG Based on Analog RRAM for IoT Security Application," 2019 IEEE International Electron Devices Meeting (IEDM), San Francisco, CA, USA, 2019, p. 14.8.1-14.8.4, doi: 10.1109/IEDM19573.2019.8993486.

(Continued)

*Primary Examiner* — Tan T. Nguyen
(74) *Attorney, Agent, or Firm* — Kimberly S. Zillig (57) ABSTRACT

A random number generator comprising resistive random-access memory (RRAM) devices including: a first electrode; a second electrode; a third electrode located between the first and second electrode; at least one electrically insulating layer separating the first electrode and the second electrode from the third electrode, wherein the at least one electrically insulating layer has a substantially uniform thickness; a first filament that is current conducting and extends through the at least one electrically insulating layer; a second filament is located in the at least one electrically insulating layer and does not extend through the at least one electrically insulating layer; a voltage source configured to apply voltage to at least one of the first electrode and the second electrode; and a voltage sensor configured to sense voltage of the third electrode in order to determine which one of the first filament or the second filament is more resistive.

20 Claims, 8 Drawing Sheets

(56) References Cited

U.S. PATENT DOCUMENTS

| | | | |
|---|---|---|---|
| 10,439,829 | B1 | 10/2019 | Lin et al. |
| 10,468,099 | B2 | 11/2019 | Wu et al. |
| 10,860,292 | B2 | 12/2020 | Ielmini et al. |
| 2020/0098428 | A1 | 3/2020 | Gaillardon et al. |
| 2020/0119259 | A1* | 4/2020 | Ahn ................ H10B 63/24 |
| 2021/0026604 | A1 | 1/2021 | Ganguly et al. |

OTHER PUBLICATIONS

International Application No. PCT/EP2023/054862, filed Feb. 27, 2023, Notification of Transmittal the International Search Report and the Written Opinion of the International Searching Authority, dated May 15, 2023, 17 pgs.

Kim, J., Ahmed, T., Nili, H., Truong, N.D., Yang, J., Jeong, D.S., Sriram, S., Ranasinghe, D.C., & Kavehei, O. (2017). Nano-Intrinsic True Random Number Generation. ArXiv, abs/1701.06020.

Chen, A., "Utilizing the Variability of Resistive Random Access Memory to Implement Reconfigurable Physical Unclonable Functions," IEEE Electron Device Letters, vol. 36, No. 2, pp. 138-140, Feb. 2015.

Unknown, "Three Technologies U.S. Defense Agencies Are Using to Battle Counterfeit Chips," https://www.sourcetoday.com/industries/three-technologies-us-defense-agencies-are-using-battle-counterfeit-chips, Apr. 4, 2017, printed Dec. 10, 2021, 13 pgs.

* cited by examiner

$$V_{OUT} = \begin{cases} 1 \text{ if } R_{105-115} > R_{115-125} \\ 0 \text{ if } R_{105-115} < R_{115-125} \end{cases}$$

$$V_{OUT} = \begin{cases} 1 \text{ if } R_{205'-215 \text{ or } 215'} > R_{215 \text{ or } 215'-205} \\ 0 \text{ if } R_{205'-215 \text{ or } 215'} < R_{215 \text{ or } 215'-205} \end{cases}$$

RESISTIVE RANDOM-ACCESS MEMORY RANDOM NUMBER GENERATOR

BACKGROUND

The present disclosure relates to random number generation, and more particularly to non-volatile, high density, integrated circuit memory devices based upon resistive random-access memory that can generate random numbers, and related methods.

Random number generation (RNG) is used in all manners of systems today. Truly random number generators (TRNG) create a series in which one value does not influence any subsequently generated value. Software-based pseudo-random number generators (PRNG) use a seed to generate numbers in a completely deterministic manner though statistically akin to numbers from TRNG. Unique hardware identification by means of physically unclonable functions (PUFs) is also used for random number generation.

SUMMARY

According to some embodiments of the disclosure, there is provided a random number generator comprising a plurality of resistive random-access memory (RRAM) devices. Each RRAM device includes: a first electrode; a second electrode; a third electrode located between the first and second electrode; at least one electrically insulating layer separating the first electrode and the second electrode from the third electrode, wherein the at least one electrically insulating layer has a substantially uniform thickness; a first filament that is current conducting and extends through the at least one electrically insulating layer; a second filament is located in the at least one electrically insulating layer and does not extend through the at least one electrically insulating layer; a voltage source configured to apply voltage to at least one of the first electrode and the second electrode; and a voltage sensor configured to sense voltage of the third electrode in order to determine which one of the first filament or the second filament is more resistive.

According to some embodiments of the disclosure, there is provided a device comprising at least one pair of resistive random-access memory (RRAM) devices, comprising a first and a second RRAM device. Each RRAM device includes a top electrode; a bottom electrode; an electrically insulating layer separating the top electrode from the bottom electrode, and having a substantially uniform thickness as the electrically insulating layer of the other RRAM device in the pair; a first filament that extends through the electrically insulating layer and connects the top electrode and the bottom electrode in the first RRAM device; and a second filament in the insulating layer of the second RRAM device that does not extend through the electrically insulating layer of the second RRAM device. The device also includes an electrically insulating divider between at least a portion of the first RRAM device and at least a portion of the second RRAM device; a voltage source configured to apply voltage to at least one pair of RRAM devices; and a voltage sensor configured to sense a difference in voltage between the first and second RRAM devices.

According to some embodiments of the disclosure, there is provided a method for generating random numbers. An operation in the method is fabricating a plurality of resistive random-access memory (RRAM) devices individually. The fabricating operation further comprises fabricating each RRAM device to include a first electrode, a second electrode, a third electrode located between the first and second electrodes, and at least one electrically insulating layer separating the first and second electrodes from the third electrode. A next operation is at least one electrically insulating layer separating the first and second electrodes from the third electrode. Further operations are introducing a first low resistance filament between the first and second electrodes of each of the RRAM devices, and introducing a second low resistance filament between the first and second electrodes of each of the RRAM devices. Another operation is applying a voltage bias to the first and second electrodes in each of the RRAM devices in order to randomly change a state of one of the first or second low resistance filaments to a state of high resistance. Yet another operation is sensing the voltage of the third electrode. The next operations are measuring a first resistance value between the first electrode and the third electrode, and measuring a second resistance value between the second electrode and the third electrode. Additional operations are: comparing the sensed voltage of the third electrode to the first and second resistance values; and based on the comparison, assigning a logical value of 1 or 0 to each RRAM device.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to RNG, and more particularly to non-volatile (NV), high density, IC memory devices based upon resistive random-access memory (RRAM or ReRAM) that can generate random numbers, and related methods. While the present disclosure is not necessarily limited to such applications, various aspects of the disclosure may be appreciated through a discussion of various examples using this context.

Semiconductor supply chain integrity is a vital security need. A loss of trusted foundries has underscored a need to verify that chips installed in critical systems are authentic. The use of resistive random-access memory RRAM devices for the generation of a unique digital fingerprint to identify a chip is desired. RRAM is a type of NV random-access (RAM) computer memory that works by changing the resistance across a dielectric solid-state material, often referred to as a memristor. The basic idea is that a dielectric, which is normally insulating, can be made to conduct through a filament or conduction path formed after the application of a sufficiently high voltage. The conduction path can arise from different mechanisms, including vacancy or metal defect migration.

This disclosure consists of memristive devices. A typical memristive device, such as RRAM, has two critical resistance states, a high resistance state (HRS) and a low resistance state (LRS). To change a memristive device from the HRS to the LRS (termed a SET operation), a voltage bias of the appropriate polarity and magnitude, $V_{SET}$, must be applied to the device. In practice, a current limit is usually imposed upon the device during a SET; otherwise, the unchecked high current through the device will permanently establish the LRS by electrically breaking down the oxide. Once the device is in the LRS, it may be returned to the HRS via a RESET operation, typically by applying a lower voltage, $V_{RESET}$, but without the current limit.

Multiple embodiments of an RRAM random number generator with different structures are disclosed herein. One feature and advantage of at least one disclosed embodiment is that the structure enables multiple generations of random number patterns that are important to secure hardware, which is applicable to both PUF and RNG. At least one disclosed embodiment uses serially connected RRAM devices with a metal oxide layer that is deposited at the same time (i.e., has the same thickness and composition in both serially connected devices) for PUF and/or RNG applications.

Another feature and advantage of at least one disclosed embodiment is that RESET of a pair of serially connected RRAM devices can be used to generate random number patterns unlike prior devices that utilize variability of individual devices.

As disclosed herein, with regard to at least one embodiment, a pair of RRAM devices, or one RRAM device with portions divided by a dielectric layer, are formed first. A positive voltage is applied to form two filaments through an insulative layer or layers in the RRAM devices or devices. A RESET bias, or voltage bias (negative voltage) is then applied to the pair of devices that are serially connected. This process will RESET one of the two devices to an HRS in a random fashion due to the stochasticity of the RESET process. Once one device is RESET to the HRS, most of the applied voltage is dropped across the one device at the HRS while the other device stays at an LRS. The device resistances of the pair of RRAM deices are compared by sensing voltage of a middle electrode between the two RRAM devices, for example. One RRAM device will have high resistance and the other RRAM device will have a low resistance. A logical value of 1 or 0 is assigned based on the two voltages or resistances relative to half of the sensing voltage. The RESET process is self-limiting and thus results in a large difference of resistance (i.e., LRS and HRS) between the pair of RRAM devices (or one at least partially divided RRAM device). This makes PUF/RNG more robust against read noise (e.g., 1/f noise, random telegraph noise) compared to conventional RRAM-based PUF utilizing variability of HRS. Thus, yet another feature and advantage of at least one disclosed embodiment is that the structure is less sensitive to read noise and retention due to a competing mechanism of RESET compared to conventional non-volatile memory (NVM)-based PUF. An additional feature and advantage of at least one embodiment of the disclosure is that a large sensing margin enables improved retention of random states.

Figure 1A:
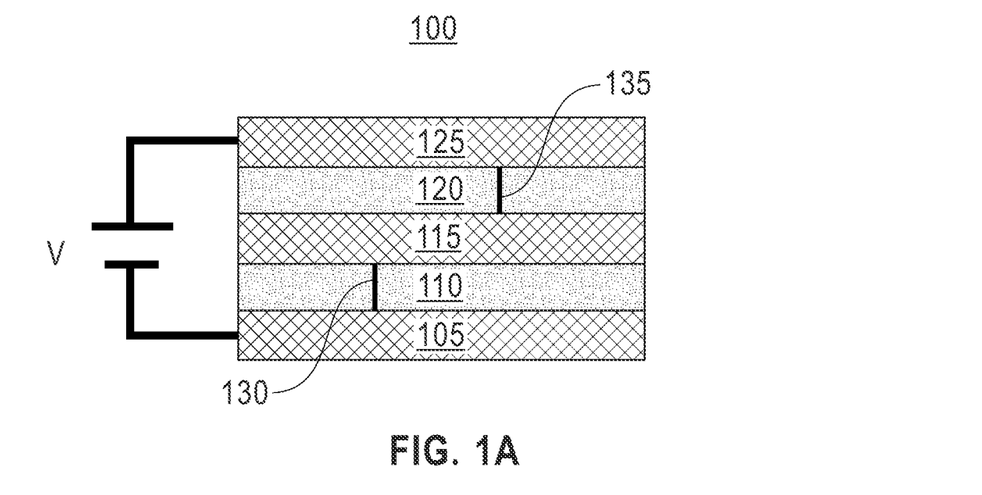
FIG. 1A is a cross-sectional view of a schematic diagram representation of a structure at a fabrication stage/step/operation of a method or process to form the structure, in accordance with embodiments of the disclosure.
Figure 1B:
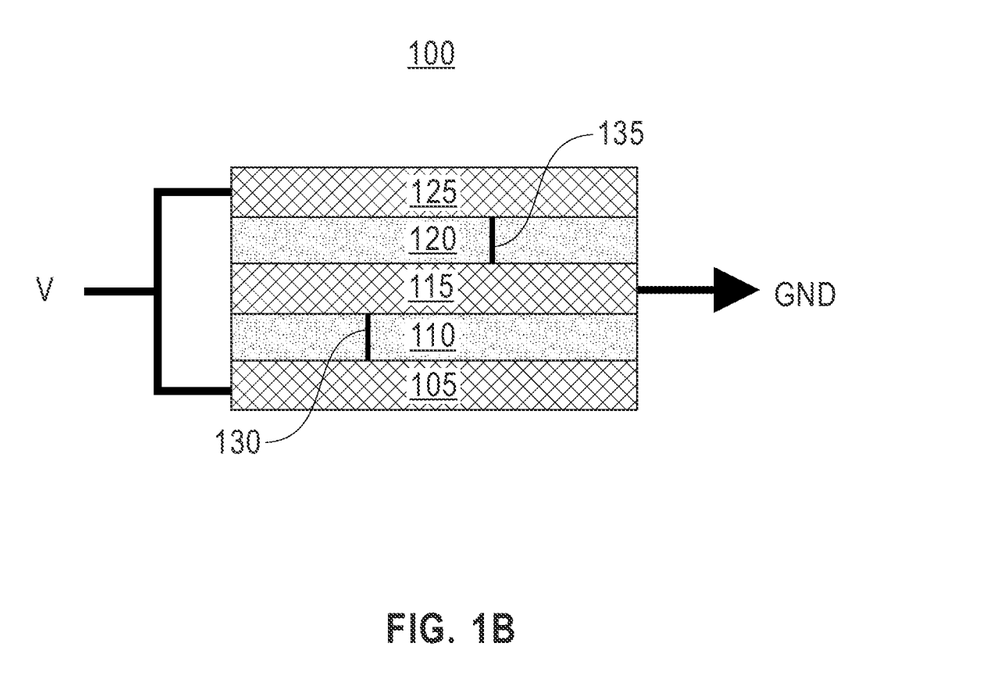
FIG. 1B is a cross-sectional view of a schematic diagram representation of a structure that is an alternative to the structure of FIG. 1A at an alternative fabrication stage/step/operation of a method or process to form the structure, in accordance with embodiments of the disclosure.
Figure 2:
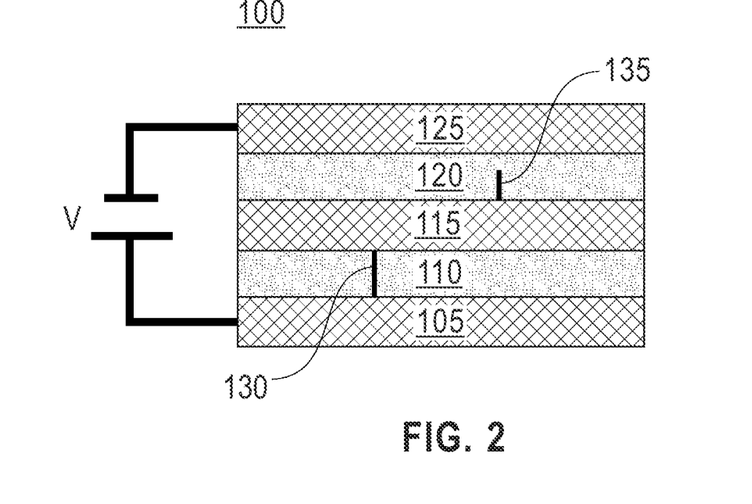
FIG. 2 is a cross-sectional view of a schematic diagram representation of the structure of either FIG. 1A or FIG. 1B at a next successive fabrication stage/step/operation of a method or process to form the structure, in accordance with embodiments of the disclosure.
Figure 3:
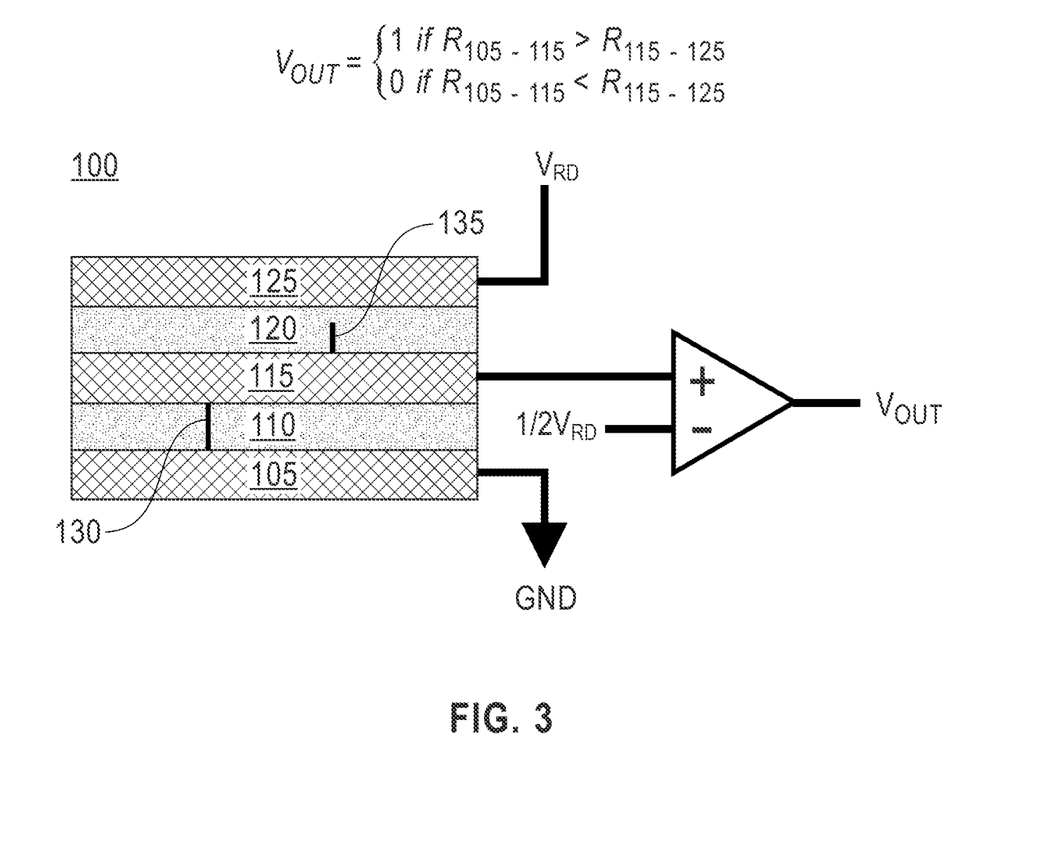
FIG. 3 is a cross-sectional view of a schematic diagram representation of the structure of FIG. 2 at a next successive fabrication stage/step/operation of a method or process to form the structure, in accordance with embodiments of the disclosure.

Referring first to FIG. 1A, a cross-sectional view of a schematic diagram representation of a structure 100 at a fabrication stage/step/operation of a method or process to form a final structure is shown. FIG. 1B is an alternative structure to that of FIG. 1A. FIGS. 2 and 3 illustrate subsequent fabrication stages/steps/operations of a method or process to form the final structure in FIG. 3. It will be understood that FIG. 3 presents, in schematic form, only a portion of a semiconductor or IC chip as finally fabricated and placed in use. Circuit elements can be formed both above and below structure 100 shown in FIG. 3. Other embodiments of structures disclosed and shown herein are also a portion of a semiconductor or IC chip. The features and formation relating to such structures are described in detail below.

For the sake of brevity, conventional techniques related to a semiconductor device or IC chip fabrication may or may not be described in detail herein. Moreover, the various tasks and process operations described herein can be incorporated into a more comprehensive procedure or process having additional operations or functionality not described in detail herein. In particular, various operations in the manufacture of semiconductor devices or ICs are well known and so, in the interest of brevity, many conventional operations will only be mentioned briefly herein or will be omitted entirely without providing the well-known process details.

FIGS. 1A and 1B show the structure 100 with a bottom electrode 105, a first insulator material layer 110 located atop the bottom electrode 105, a middle electrode 115 located atop the first insulator material layer 110, a second insulator material layer 120 located atop the middle electrode 115, and a top electrode 125 located atop the second insulator material layer 120. The arrangement of the electrodes and layers described above (105, 110, 115, 120, 125) can be described as "horizontally arranged" or "horizontally disposed," meaning the layers and the electrodes extend along a horizontal direction and are layered on top of each other. Horizontally arranged can also be described as being vertically stacked. Alternatively, the electrodes and layers (105, 110, 115, 120, 125) can be described as being parallel with respect to each other. Alternatively, the arrangement of the electrodes and layers (105, 110, 115, 120, 125) can be described as being arranged or laid in parallel.

The electrodes 105, 115, 125 (and electrodes of other embodiments described herein below) can be comprised, for example, of any suitable conductive and semiconductive materials, including but not limited to, for example, n-doped polysilicon and p-doped polysilicon, carbon (C), aluminum (Al), copper (Cu), nickel (Ni), chromium (Cr), cobalt (Co), ruthenium (Ru), rhodium (Rh), metals including palladium (Pd), silver (Ag), platinum (Pt), gold (Au), iridium (Jr), tantalum (Ta), tungsten (W), conductive metal nitrides, tantalum silicides, tungsten silicides, nickel silicides, cobalt silicides, titanium silicides, conductive metal oxides including ruthenium (IV) oxide ($RuO_2$) and transition metal nitrides, such as titanium nitride (TiN), tantalum nitride (TaN), tungsten nitride (WN) or 1,4,7-triacyclononane (TaCN). The electrodes 105, 115, 125 can be applied, for example, by chemical vapor deposition (CVD), plasma-enhanced chemical vapor deposition (PE-CVD), plasma-enhanced atomic layer deposition (PE-ALD), thermal atomic layer deposition, and physical vapor deposition (PVD), etc.

The first and second insulator material layers 110, 120 (and insulator material layers of other embodiments described herein below) can be comprised, for example, of an electrically insulating material including hafnium oxide ($HfO_2$), silicon oxide ($SiO_2$) or silicon nitride ($Si_3N_4$) among others. The first and second insulator material layers 110, 120 can be applied, for example, using CVD, PE-CVD, PVD, PE-ALD, thermal atomic layer deposition, high-density chemical vapor deposition (HDP-CVD), and spin-on dielectric processes (SOD), etc.

In FIG. 1A, a positive voltage is shown applied between the bottom electrode 105 and the top electrode 125. The application of the positive voltage (by a battery, for example) between the two outer electrodes (the bottom electrode 105 and the top electrode 125) results in the formation or creation of a first filament 130 in insulator material layer 110 between the bottom electrode 105 and the middle electrode 115. The application of the positive voltage also results in the creation of a second filament 135 in second insulator material layer 120 between the middle electrode 115 and top electrode 125. Alternatively, in FIG. 1B, a voltage bias is shown applied between the bottom electrode 105 and the top electrode 125, and the middle electrode 115 is shown grounded (shown as "GND"). First filament 130 and second filament 135 are similarly formed as shown in the first and second insulator material layers 110, 120. For both alternative process operations of FIG. 1A and FIG. 1B, the first and second filaments 130, 135 formed are low resistance filaments.

In FIG. 2, a next process operation after FIG. 1A or 1B is shown, in which a voltage source is reversed to supply a negative voltage or RESET bias. As a result of the voltage being reversed, both of the first and second filaments 130, 135 tend to want to be reduced (or shrink), or brought to an HRS. However, only one of the two filaments 130, 135 is reduced or broken and brought to the HRS, which occurs randomly. In FIG. 2, first filament 130 is shown still bridging between the electrodes 105 and 115 or in an LRS while second filament 135 is shown reduced (i.e., a broken or open circuit), but the opposite could have occurred alternatively. The random nature of one of the two filaments being reduced while the other filament remains bridging results in the random number generation of the disclosure. Once one of the filaments is reduced, nearly all of the applied voltage will drop between the two electrodes that the filament was originally bridging (in the case shown of filament 135 is reduced most of the voltage drop will be between conductors 115 and 125). As such, no voltage is available to reduce the bridging filament (filament 130 in the above example).

FIG. 3 shows a next process operation after FIG. 2, in which a positive voltage is applied to the top electrode 125 and the bottom electrode 105 is grounded. The applied voltage is a "read voltage" ($V_{RD}$), which is typically smaller in amplitude than the "forming voltage" that was needed in the previous steps to form the filaments. The device resistances of the pair of RRAM devices in the structure 100 are compared between the two RRAM devices. A logical value of 1 or 0 is assigned based on the voltage of the middle electrode 115 relative to half of the sense voltage. As shown in FIG. 3, the bottom electrode 105 and the middle electrode 115 are shorted by first filament 130 and, therefore, are at the same potential. The operational amplifier (shown as a triangle with a "+" and "−" inputs), and otherwise known as a "comparator," compares the "+" terminal voltage to the "−" terminal voltage and since the voltage difference is 0, that is not larger than ½ $V_{RD}$, then the voltage output ($V_{OUT}$) of the operational amplifier is 0. If the first filament 130 and second filament 135 were instead switched and the first filament 130 was reduced instead (not shown in the figure), then the top electrode 125 and the middle electrode 115 would be shorted by the second filament 135 instead and they would be at the same potential. The operational amplifier, or comparator, then would compare the "+" terminal voltage to the "−" terminal voltage and since $V_{RD}$ would be larger than that of ½ $V_{RD}$, then the $V_{OUT}$ would be equal to 1.

Another way to describe FIG. 3 is, for example, if the resistance between the bottom electrode 105 and the middle electrode 115 is greater than resistance measured between the top electrode 125 and the middle electrode 115, then a logical value of 1 is assigned. In addition, if the resistance between the bottom electrode 105 and the middle electrode 115 is less than resistance measured between the top electrode 125 and the middle electrode 115, then a logical value of 0 is assigned.

Figure 4A:
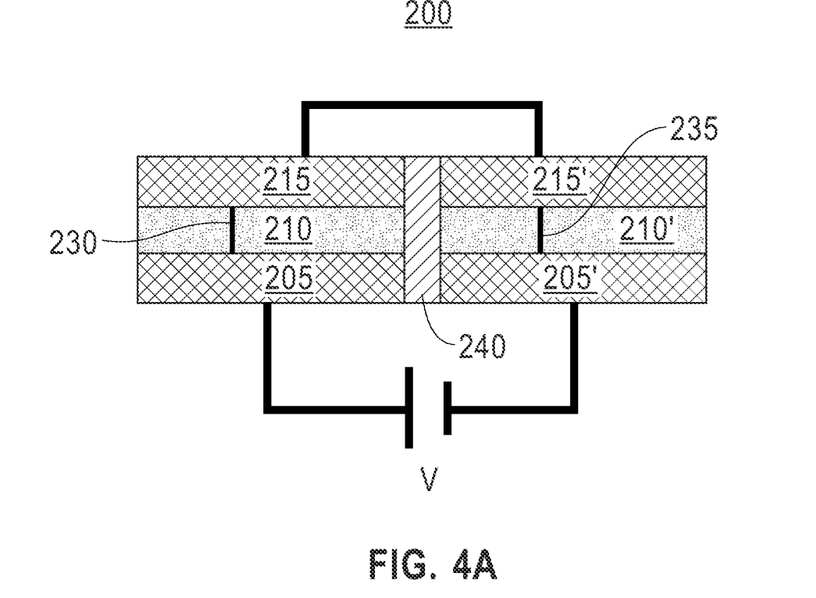
FIG. 4A is a cross-sectional view of a schematic diagram representation of a structure at a fabrication stage/step/operation of a method or process to form the structure, in accordance with embodiments of the disclosure.
Figure 4B:
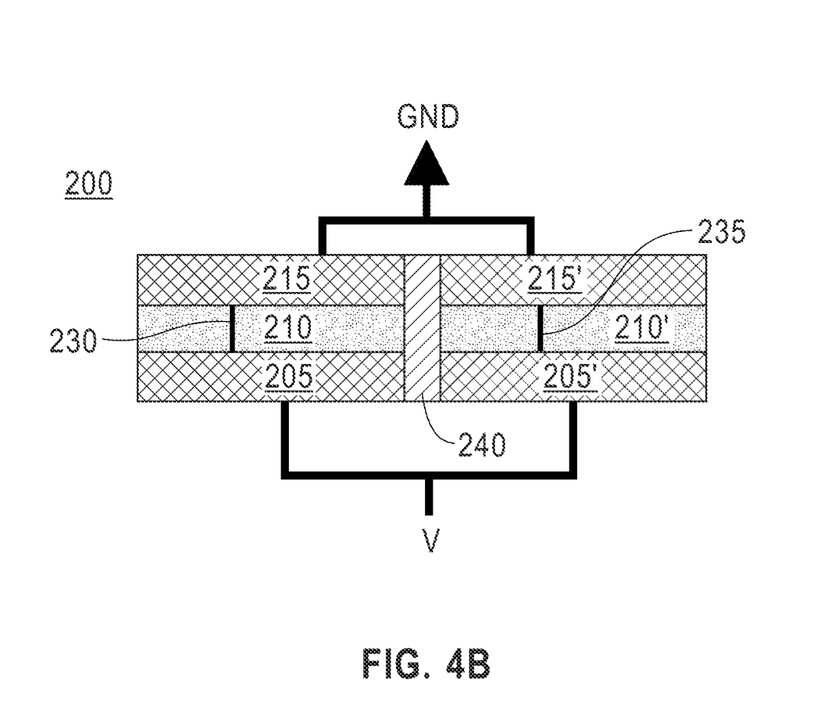
FIG. 4B is a cross-sectional view of a schematic diagram representation of a structure that is an alternative to the structure of FIG. 4A at an alternative fabrication stage/step/operation of a method or process to form the structure, in accordance with embodiments of the disclosure.

FIGS. 4A and 4B show a structure 200 of two serially connected RRAM devices. The two RRAM devices in the structure 200 can be formed as one unit by a bottom electrode 205 with an insulator material layer 210 laid atop the bottom electrode 205, and including a top electrode 215 laid atop the insulator material layer 210. In an operation in a process to form the structure 200 as shown in FIGS. 4A and 4B, two portions of such a metal-insulator-metal (MIM) structure are cut apart and a dielectric material separator 240 made of silicon nitride, for example, is placed to divide the two portions of the MIM structure to form the structure 200. As a result of the two RRAM devices being formed at the same time, the insulator material layers of the two devices are substantially uniform or nearly uniform in thickness and in composition. If the thicknesses and composition of the insulator material layers are the same in both RRAM devices, where filaments can be formed, then less bias can be present in the structure and system of random number generation.

FIGS. 4A and 4B show a first RRAM device (on the left) formed of the bottom electrode 205, the insulator material layer 210 and the top electrode 215, and a second RRAM device (on the right) formed of the same layers as in the first RRAM device, but with the layers indicated with a mark. The second RRAM device includes bottom electrode 205', middle electrode 210' and top electrode 215'. FIG. 4A shows a first filament 230 and a second filament 235 formed in first and second RRAM devices, respectively. The first and the second filaments 230, 235 were formed by a positive voltage being applied (such as by a battery, for example) between the two RRAM devices. In FIG. 4B, alternatively, first filament 230 and second filament 235 are formed by the bottom electrodes 205 and 205' having a positive voltage applied and a ground applied to the top electrodes 215 and 215'.

Figure 5:
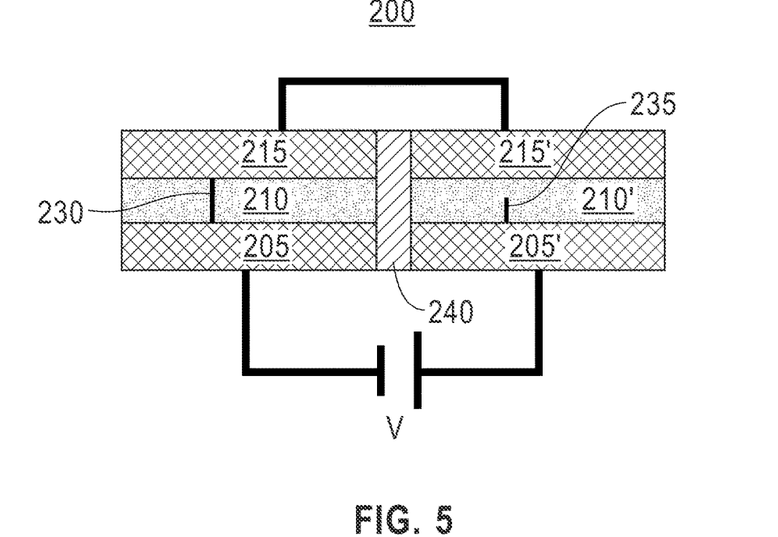
FIG. 5 is a cross-sectional view of a schematic diagram representation of the structure of either FIG. 4A or FIG. 4B at a next successive fabrication stage/step/operation of a method or process to form the structure, in accordance with embodiments of the disclosure.

In FIG. 5, a next process operation after FIG. 4A or FIG. 4B is shown, in which a voltage source is reversed to supply a negative voltage or RESET bias between the first and the second bottom electrodes 205, 205'. As a result of the voltage being reversed, both of the first and second filaments 230, 235 tend to want to be reduced (or shrink), or brought to an HRS. However, only one of the two filaments 230, 235 is randomly reduced or broken and brought to an HRS. In FIG. 5, first filament 230 is shown still bridging or in an LRS while second filament 235 is shown reduced (i.e., broken or open), although the opposite could have occurred alternatively.

Figure 6:
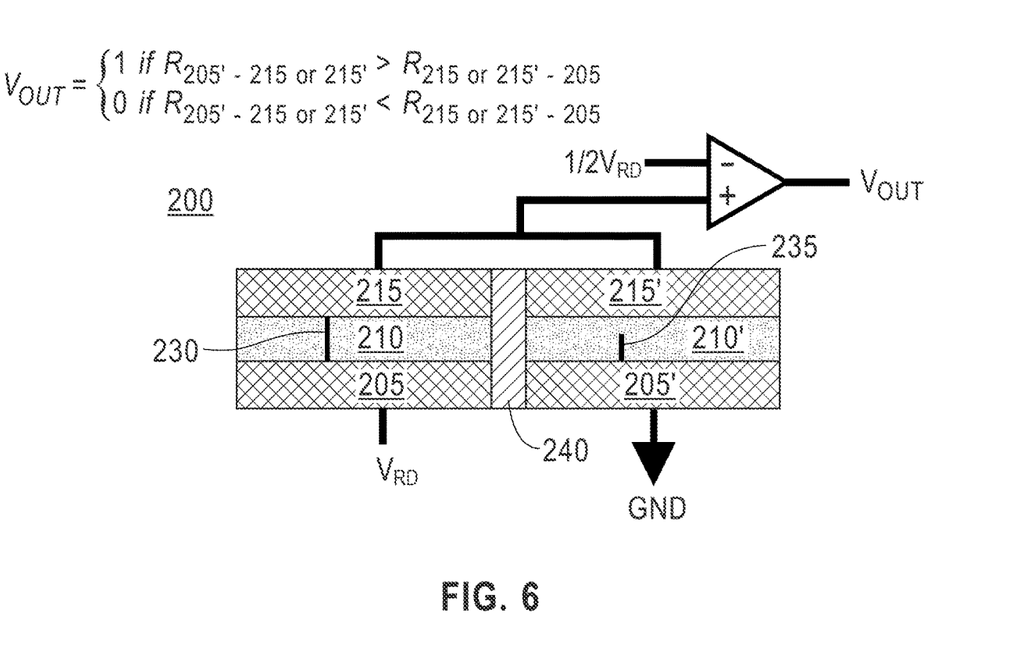
FIG. 6 is a cross-sectional view of a schematic diagram representation of the structure of FIG. 5 at a next successive fabrication stage/step/operation of a method or process to form the structure, in accordance with embodiments of the disclosure.

FIG. 6 shows a next process operation after FIG. 5, in which a read voltage is applied to the electrode 205 and the electrode 205' is grounded. The device resistances of the pair of RRAM devices in the structure 200 are measured by sensing voltage of the top electrodes 215 and 215' between the two RRAM devices. A logical value of 1 or 0 is assigned based on the voltage of the top electrodes 215 and 215' relative to half of the sense voltage. As shown in FIG. 6, the bottom electrode 205 and the top electrode 215 are shorted by the first filament 230 and, therefore, are at the same potential, $V_{RD}$. The operational amplifier or "comparator" (shown as a triangle with a "+" and "−" inputs) compares the "+" terminal voltage to the "−" terminal voltage and since the voltage difference is positive (about ½ $V_{RD}$), then the voltage output ($V_{OUT}$) of the operational amplifier is saturated to a logical 1. If the first filament 230 and the second filament 235 were instead switched and the first filament 230 was reduced instead (not shown in the figure), then the top electrode 215' and the bottom electrode 205' would be shorted by the second filament 235 instead and they would be at the same potential. The operational amplifier then would compare the "+" terminal voltage to the "−" terminal voltage and since the voltage difference would be negative, then the $V_{OUT}$ would saturate to a logical 0.

As shown by the inequalities provided in FIG. 6, for example, if the resistance between the bottom electrode 205 and either the top electrode 215 or 215' is less than resistance measured between either top electrode 215 or 215' and bottom electrode 205', then a logical value of 1 is assigned. In addition, if the resistance between the bottom electrode 205' and either top electrode 215 or 215' is less than resistance measured between either top electrode 215 or 215' and bottom electrode 205, then a logical value of 0 is assigned.

Figure 7A:
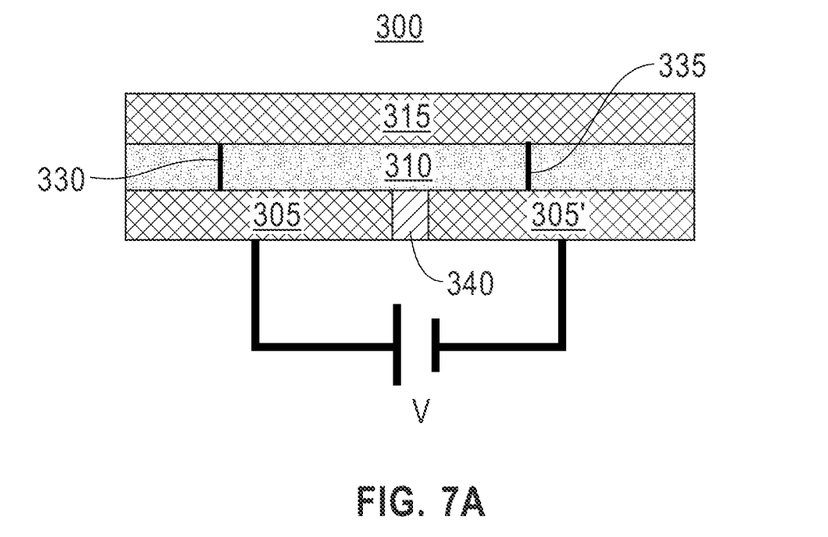
FIG. 7A is a cross-sectional view of a schematic diagram representation of a structure at a fabrication stage/step/operation of a method or process to form the structure, in accordance with embodiments of the disclosure.
Figure 7B:
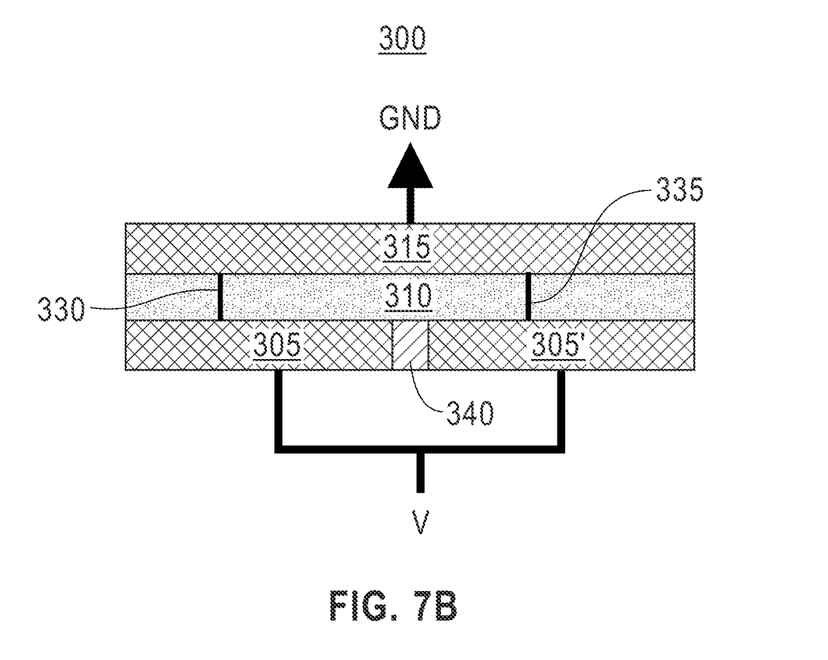
FIG. 7B is a cross-sectional view of a schematic diagram representation of a structure that is an alternative to the structure of FIG. 7A at an alternative fabrication stage/step/operation of a method or process to form the structure, in accordance with embodiments of the disclosure.

FIGS. 7A and 7B show a structure 300, including a top electrode 315 laid atop an insulator material layer 310, which is laid atop first and second bottom electrodes 305, 305'. A dielectric material separator 340 made of silicon nitride, for example, is placed to divide the first and the second bottom electrodes 305, 305'. In an operation in a process to form the structure 300 as shown in FIGS. 7A and 7B, the two bottom electrodes 305, 305' can be cut or otherwise separated/divided, and the dielectric material separator 340 can be inserted between the two bottom electrodes 305, 305'. As a result of the structure 300, the insulator material layer 310 is substantially uniform or uniform in thickness. If the thickness of the insulator material layer 310 is substantially uniform, which is where filaments can be formed, then less bias can be present in the structure 300 and the resulting system of random number generation.

FIGS. 7A and 7B show a first filament 330 and a second filament 335 formed in the insulator material layer 310, with the first filament 330 connecting the first bottom electrode 305 and the top electrode 315, and the second filament 335 connecting the second bottom electrode 305' and the top electrode 315. In FIG. 7A, the first and the second filaments 330, 335 were formed by a positive voltage being applied between the first and the second bottom electrodes 305, 305'. In FIG. 7B, alternatively, the first filament 330 and the second filament 335 are formed by a positive voltage applied between the first and the second bottom electrodes 305, 305' and a ground applied to the top electrode 315.

Figure 8:
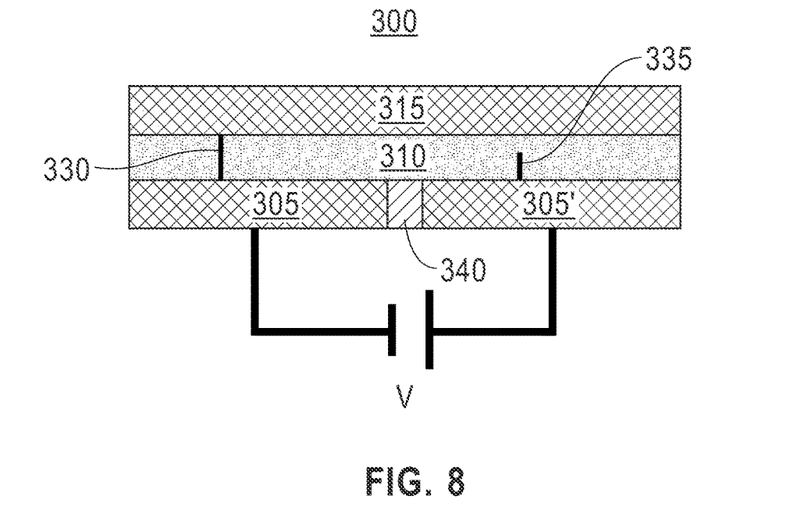
FIG. 8 is a cross-sectional view of a schematic diagram representation of the structure of either FIG. 7A or FIG. 7B at a next successive fabrication stage/step/operation of a method or process to form the structure, in accordance with embodiments of the disclosure.

In FIG. 8, a next process operation after FIG. 7A or 7B is shown, in which a voltage source is reversed to supply a negative voltage or RESET bias between the first and the second bottom electrodes 305, 305'. As a result of the voltage being reversed, both of the first and the second filaments 330, 335 tend to want to be reduced (or shrink), or brought to an HRS. However, only one of the two filaments 330, 335 is reduced or broken and brought to the HRS, which occurs randomly. In FIG. 8, the first filament 330 is shown still bridging the bottom electrode 305 and the top electrode 315 or in an LRS while the second filament 335 is shown reduced (i.e., broken or open), but the opposite could have occurred alternatively.

Figure 9:
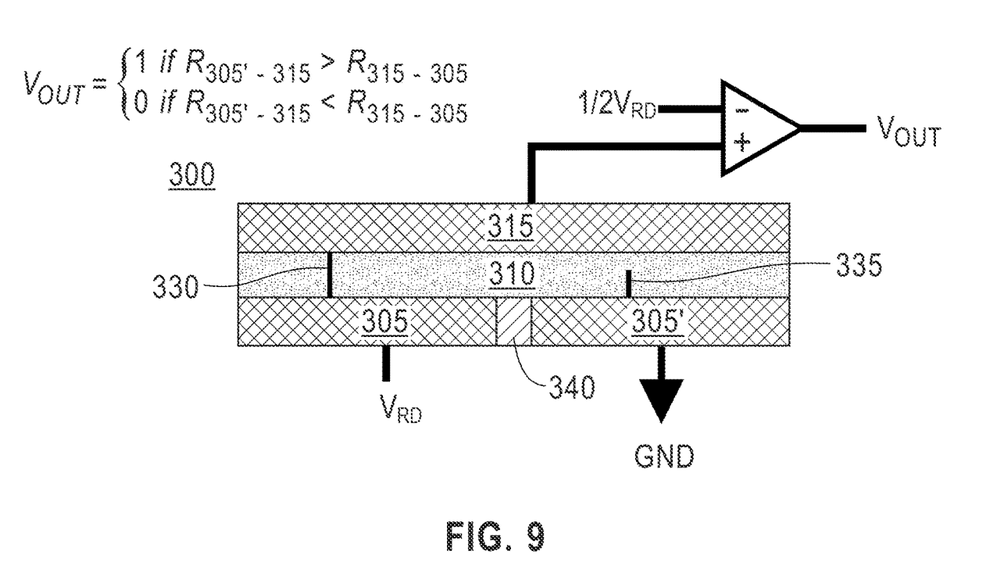
FIG. 9 is a cross-sectional view of a schematic diagram representation of the structure of FIG. 8 at a next successive fabrication stage/step/operation of a method or process to form the structure, in accordance with embodiments of the disclosure.

FIG. 9 shows a next process operation after FIG. 8, in which a voltage is applied to the first bottom electrode 305 and the second bottom electrode 305' is grounded. The device resistance in the structure 300 is measured by sensing the voltage of the top electrode 315. A logical value of 1 or 0 is assigned based on the voltage of the top electrode 315 relative to half of the sense voltage. As shown in FIG. 9, the bottom electrode 305 and the top electrode 315 are shorted by the first filament 330 and, therefore, are at the same potential. The operational amplifier or "comparator" (shown as a triangle with a "+" and "−" inputs) compares the "+" terminal voltage to the "−" terminal voltage, and since the voltage difference is about positive $\frac{1}{2}V_{RD}$, then the voltage output ($V_{OUT}$) of the operational amplifier is logical 1. If the first filament 330 and the second filament 335 were instead switched and the first filament 330 was reduced instead (not shown in the figure), then the top electrode 315 and the bottom electrode 305' would be shorted by the second filament 335 instead and they would be at the same potential. The operational amplifier, or "comparator," then would compare the "+" terminal voltage to the "−" terminal voltage and since the voltage difference would be negative, then $V_{OUT}$ would be equal to logical 0.

As shown in FIG. 9, for example, if the resistance between the second bottom electrode 305' and the top electrode 315 is greater than resistance measured between the top electrode 315 and the first bottom electrode 305, then a logical value of 1 is assigned. In addition, if the resistance between the second bottom electrode 305' and the top electrode 315 is less than the resistance measured between the top electrode 315 and the first bottom electrode 305, then a logical value of 0 is assigned.

Figure 10:
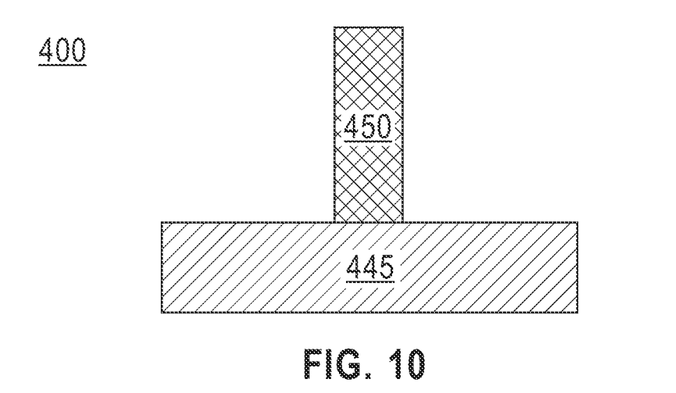
FIG. 10 is a cross-sectional view of a schematic diagram representation of a structure at a fabrication stage/step/operation of a method or process to form the structure, in accordance with embodiments of the disclosure.

Referring to FIG. 10, a first operation is shown in a process to form a structure 400 with at least one fin and additional regions (two of such regions shown in figure). A base or substrate 445 is provided, with a first metal fin 450 formed on the base 445. The base 445 can comprise a semiconductor substrate formed of silicon (Si), although other suitable materials can be used. One process that can be used to form the first metal fin 450 is depositing a conductor film such as W, then using lithography followed by reactive ion etching (RIE) to define and etch the metal, or conductive, fin 450. Materials that can be used for the metal fin 450 include, but are not limited to, W, TiN, Ta, Cu and Ag.

Figure 11:
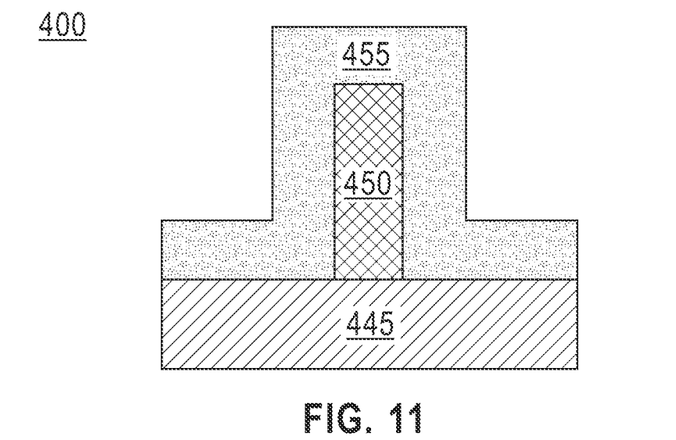
FIG. 11 is a cross-sectional view of a schematic diagram representation of the structure of FIG. 10 at a next successive fabrication stage/step/operation of a method or process to form the structure, in accordance with embodiments of the disclosure.

FIG. 11 shows the next process operation subsequent to that of FIG. 10. A conformal dielectric material layer 455 is applied over the first metal fin 450 and base 445. Methods that can be used to apply conformal dielectric material layer 455 include, but are not limited to, atomic layer deposition (ALD), CVD, as well as partial oxidation of the first metal fin 450 (for example, for a W fin, one can form a thin "skin" of tungsten trioxide ($WO_3$)).

Figure 12:
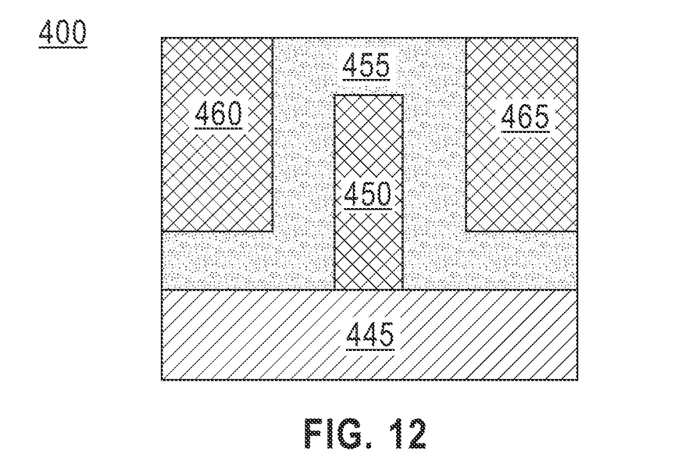
FIG. 12 is a cross-sectional view of a schematic diagram representation of the structure of FIG. 11 at a next successive fabrication stage/step/operation of a method or process to form the structure, in accordance with embodiments of the disclosure.

FIG. 12 next shows the structure 400 after the next two operations in which: 1) metal material is deposited to form a first metal region 460 and a second metal region 465 on or opposites sides of (in other words that "sandwich") the first metal fin 450 covered with the conformal dielectric layer 455, and 2) the structure 400 is planarized. The first and second metal regions 460 and 465 can be generally formed as shown "regions," but other shapes and configurations are also contemplated. The formation of such first and second metal regions 460, 465 includes the deposition of a metal such as W, or TiN using CVD or physical vapor deposition (PVD) (sputtering), then polishing back the excess metal over the top of base 445 by methods such as chemical mechanical polish (CMP).

The arrangement of the fin, the regions, and the dielectric layer (450, 455, 460, 465) described above can be described as "vertically arranged" or "vertically disposed," meaning the layer, the fin and the regions (450, 455, 460, 465) substantially extend upward along a vertical direction and are arranged beside each other. The term refers to their arrangement with respect to each other (the fin, regions, and dielectric layer (450, 455, 460, 465)). Alternatively, the fins, the regions and the layer (450, 455, 460, 465) can be described as being applied or laid in parallel with respect to each other.

Figure 13:
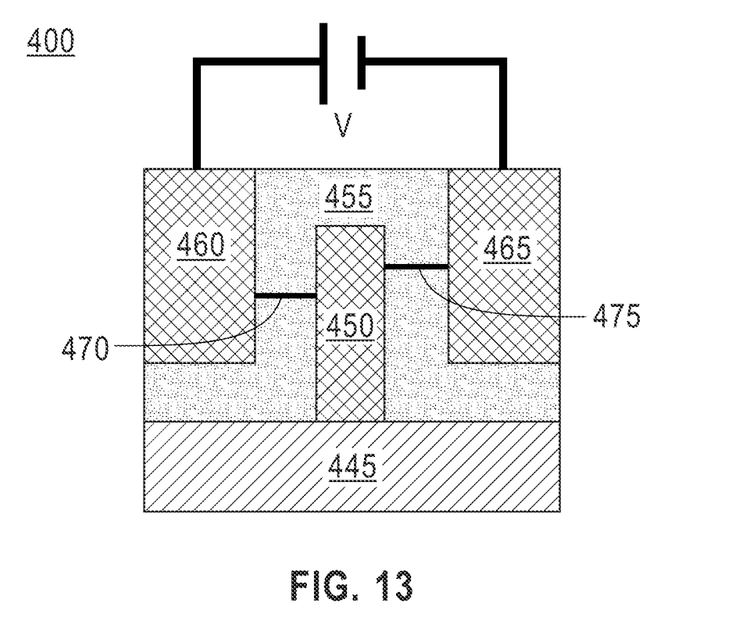
FIG. 13 is a cross-sectional view of a schematic diagram representation of the structure of FIG. 12 at a next successive fabrication stage/step/operation of a method or process to form the structure, in accordance with embodiments of the disclosure.

In FIG. 13, a next operation is shown in which a positive voltage is applied between the first region 460 and the second region 465 (for example, by using a battery). As a result of the positive voltage being applied, first filament 470 and second filament 475 are formed in opposite sides of the conformal layer 455, with the first filament 470 connecting the first metal fin 450 to the first region 460, and the second filament 475 connecting the first metal fin 450 to the second region 465.

Figure 14:
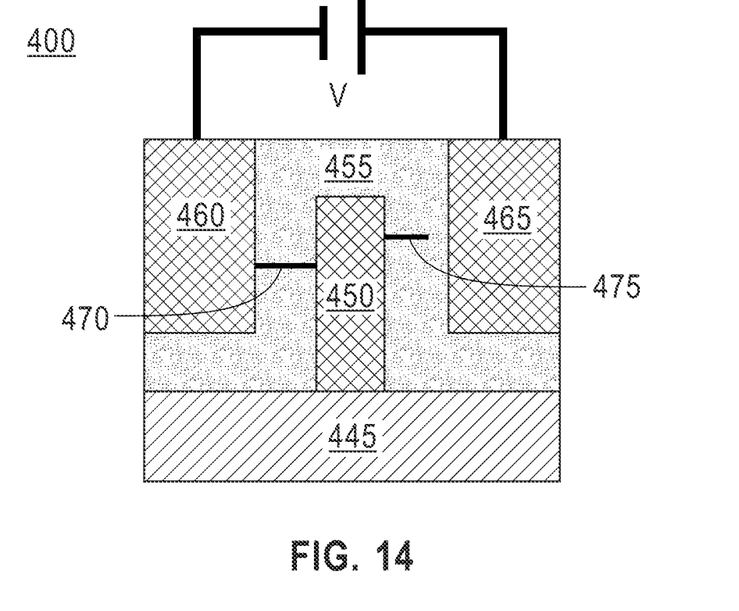
FIG. 14 is a cross-sectional view of a schematic diagram representation of the structure of FIG. 13 at a next successive fabrication stage/step/operation of a method or process to form the structure, in accordance with embodiments of the disclosure.

In FIG. 14, a next process operation after FIG. 13 is shown, in which a voltage source is reversed to supply a negative voltage or RESET bias between the first and second regions 460, 465. As a result of the voltage being reversed, both of the first and second filaments 470, 475 tend to want to be reduced (or shrink), or brought to an HRS. However, only one of the two filaments 470, 475 is reduced or broken and brought to the HRS, which occurs randomly. In FIG. 14, the first filament 470 is shown still bridging, or in an LRS, while the second filament 475 is shown reduced (i.e., broken or open), but the opposite could have occurred alternatively. As with earlier disclosed embodiments, a logical value of 1 or 0 can be assigned based on the voltage of the first and second regions 460, 465 relative to half of the sense voltage. As shown, the fin 450 and the first region 460 are shorted by the first filament 470 and, therefore, are at the same potential. An operational amplifier, or "comparator," can be used to compare voltages, and assign the logical values of 0 or 1 accordingly, as in other embodiments disclosed herein The disclosed structures 100, 200, 300 and 400 can enable multiple generations of random patterns that are important for secure hardware. The structures 100, 200, 300 and 400 are applicable to both PUF and RNG. RNG is essential for generating random cryptography keys for secure trans Fission protocols. Recently RNG concepts based on the switching variability in low-voltage memory technologies, such as spin transfer torque (STT) magnetic random-access memory (MRAM) and RRAM have been proposed. The switching statistical variability in RRAM was similarly applied to develop PUFs, and to improve learning in neuromorphic circuits.

For purposes of this description, certain aspects, advantages, and novel features of the embodiments of this disclosure are described herein. The disclosed methods, and systems should not be construed as being limiting in any way.

Instead, the present disclosure is directed toward all novel and nonobvious features and aspects of the various disclosed embodiments, alone and in various combinations and subcombinations with one another. The methods, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A random number generator, comprising:
   a plurality of resistive random-access memory (RRAM) devices,
   wherein each RRAM device includes:
   a first electrode;
   a second electrode;
   a third electrode located between the first and second electrode;
   at least one electrically insulating layer separating the first electrode and the second electrode from the third electrode, wherein the at least one electrically insulating layer has a substantially uniform thickness;
   a first filament that is current conducting and extends through the at least one electrically insulating layer;
   a second filament is located in the at least one electrically insulating layer and does not extend through the at least one electrically insulating layer;
   a voltage source configured to apply voltage to at least one of the first electrode and the second electrode; and
   a voltage sensor configured to sense voltage of the third electrode in order to determine which one of the first filament or the second filament is more resistive.

2. The random number generator of claim 1, wherein the at least one electrically insulating layer comprises a first electrically insulating layer separating the first electrode from the third electrode and a second electrically insulating layer separating the second electrode from the third electrode.

3. The random number generator of claim 2, wherein the first, second and third electrodes and the first and second electrically insulating layers are layered in a horizontal arrangement.

4. The random number generator of claim 1, wherein the first, second and third electrodes are arranged in parallel with respect to each other.

5. The random number generator of claim 1, wherein the at least one electrically insulating layer is a single conformal layer of electrically insulating material.

6. The random number generator of claim 1, wherein the at least one electrically insulating layer has a substantially uniform composition.

7. The random number generator of claim 1, wherein the at least one electrically insulating layer has a substantially uniform thickness.

8. A device, comprising:
   at least one pair of resistive random-access memory (RRAM) devices, comprising a first and a second RRAM device,
   wherein each RRAM device includes:
   a top electrode;
   a bottom electrode;
   an electrically insulating layer separating the top electrode from the bottom electrode, and having a substantially similar thickness to the electrically insulating layer of another RRAM device in the pair;
   a first filament that extends through the electrically insulating layer and connects the top electrode and the bottom electrode in the first RRAM device; and
   a second filament in the insulating layer of the second RRAM device that does not extend through the electrically insulating layer of the second RRAM device;
   an electrically insulating divider between at least a portion of the first RRAM device and at least a portion of the second RRAM device;
   a voltage source configured to apply voltage to the at least one pair of RRAM devices; and
   a voltage sensor configured to sense a difference in voltage between the first and second RRAM devices.

9. The device of claim 8, further comprising:
   a comparator configured to compare the difference in voltage between the first and second RRAM devices.

10. The device of claim 9, wherein the comparator is configured to assign a logical value of 1 or 0 to each RRAM device.

11. The device of claim 8, wherein the electrically insulating divider separates the bottom electrode of the first RRAM device from the bottom electrode of the second RRAM device, and the top electrode of the first RRAM device from the top electrode of the second RRAM device.

12. The device of claim 8, wherein the electrically insulating divider separates the bottom electrode of the first RRAM device from the bottom electrode of the second RRAM device.

13. The device of claim 8, wherein the at least one electrically insulating layer has a substantially uniform thickness.

14. A method for generating random numbers, comprising:

fabricating a plurality of resistive random-access memory (RRAM) devices individually, wherein fabricating further comprises fabricating each RRAM device to include:
- a first electrode;
- a second electrode;
- a third electrode located between the first and second electrodes; and
- at least one electrically insulating layer separating the first and second electrodes from the third electrode;

introducing a first low resistance filament between the first and second electrodes of each of the RRAM devices;

introducing a second low resistance filament between the first and second electrodes of each of the RRAM devices;

applying a voltage bias to the first and second electrodes in each of the RRAM devices in order to randomly change a state of one of the first or second low resistance filaments to a state of high resistance;

sensing voltage of the third electrode;

measuring a first resistance value between the first electrode and the third electrode;

measuring a second resistance value between the second electrode and the third electrode;

comparing the sensed voltage of the third electrode to the first and second resistance values; and based on the comparing, assigning a logical value of 1 or 0 to each RRAM device.

15. The method of claim 14, wherein the logical value of 1 is assigned when the first resistance value is greater than the second resistance value.

16. The method of claim 14, wherein the logical value of 0 is assigned when the first resistance value is less than the second resistance value.

17. The method of claim 14, wherein the at least one electrically insulating layer of each RRAM device comprises a first electrically insulating layer separating the first electrode from the third electrode and a second electrically insulating layer separating the second electrode from the third electrode.

18. The method of claim 17, wherein the first, second and third electrodes and the first and second electrically insulating layers are layered in a horizontal arrangement.

19. The method of claim 14, wherein the first, second and third electrodes are arranged in parallel with respect to each other.

20. The method of claim 14, wherein the at least one electrically insulating layer is a single conformal layer of electrically insulating material.

* * * * *